(12) United States Patent
Haiberger et al.

(10) Patent No.: US 12,237,444 B2
(45) Date of Patent: Feb. 25, 2025

(54) RADIATION-EMITTING COMPONENT AND METHOD FOR PRODUCING A RADIATION-EMITTING COMPONENT

(71) Applicant: OSRAM OLED GmbH, Regensburg (DE)

(72) Inventors: Luca Haiberger, Regensburg (DE); Sam Chou, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 18/489,511

(22) Filed: Oct. 18, 2023

(65) Prior Publication Data

US 2024/0047625 A1 Feb. 8, 2024

Related U.S. Application Data

(63) Continuation of application No. 16/969,748, filed as application No. PCT/EP2019/052750 on Feb. 5, 2019, now Pat. No. 11,824,142.

(30) Foreign Application Priority Data

Feb. 20, 2018 (DE) .......................... 102018103748.1

(51) Int. Cl.
  *H01L 33/48* (2010.01)
  *H01L 33/50* (2010.01)
  *H01L 33/60* (2010.01)

(52) U.S. Cl.
  CPC ............ *H01L 33/486* (2013.01); *H01L 33/60* (2013.01); *H01L 33/50* (2013.01); *H01L 2933/0041* (2013.01); *H01L 2933/0058* (2013.01); *H01L 2933/0091* (2013.01)

(58) Field of Classification Search
  CPC ..... H01L 2933/0041; H01L 2933/0058; H01L 2933/0033; H01L 33/48–648; H01L 2933/005; H01L 2933/0066–0091
  See application file for complete search history.

(56) References Cited

U.S. PATENT DOCUMENTS

| | | | |
|---|---|---|---|
| 7,293,908 B2 * | 11/2007 | Beeson ............. | G02F 1/133603 362/555 |
| 7,889,421 B2 | 2/2011 | Narendran et al. | |
| 10,672,960 B2 * | 6/2020 | Li ........................... | H01L 33/56 |
| 2007/0284600 A1 | 12/2007 | Shchekin et al. | |

(Continued)

FOREIGN PATENT DOCUMENTS

| | | |
|---|---|---|
| DE | 102010027253 A1 | 1/2012 |
| DE | 102011050450 A1 | 11/2012 |

(Continued)

*Primary Examiner* — Jonathan Han
(74) *Attorney, Agent, or Firm* — ArentFox Schiff LLP

(57) ABSTRACT

A radiation-emitting component is specified with
  a carrier having a cavity,
  a radiation-emitting semiconductor chip which is arranged on a bottom surface delimiting the cavity and which is configured to generate primary electromagnetic radiation, and
  a first reflector layer arranged above a top surface of the semiconductor chip, wherein
the carrier is transparent in places to the primary electromagnetic radiation, and
the semiconductor chip is spaced apart from at least one side surface delimiting the cavity.

13 Claims, 6 Drawing Sheets

(56) References Cited

U.S. PATENT DOCUMENTS

Figure 1:
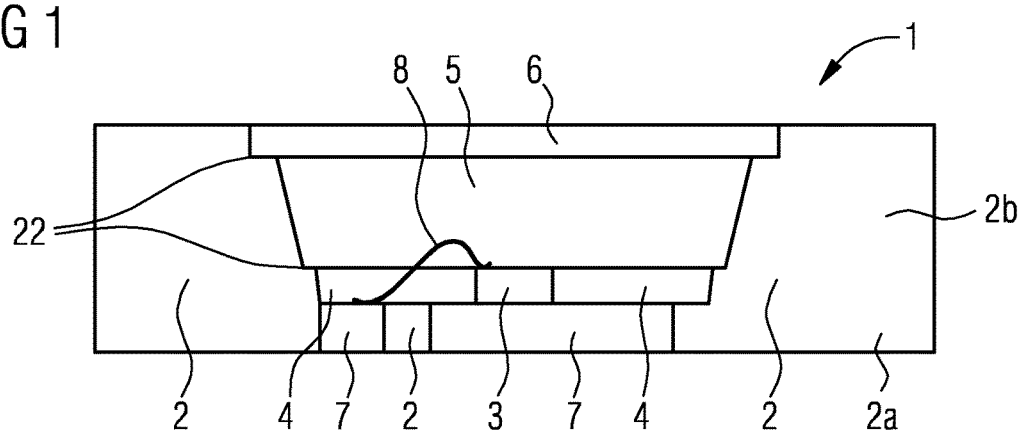

| | | | |
|---|---|---|---|
| 2008/0128725 A1* | 6/2008 | Hsing Chen | G02B 19/0071 |
| | | | 257/E33.059 |
| 2012/0012872 A1 | 1/2012 | Shen et al. | |
| 2012/0061709 A1* | 3/2012 | Pachler | H01L 33/54 |
| | | | 257/E33.072 |
| 2012/0112872 A1 | 5/2012 | Kang et al. | |
| 2013/0328078 A1 | 12/2013 | Wu et al. | |
| 2013/0334559 A1 | 12/2013 | Vdovin et al. | |
| 2014/0117396 A1* | 5/2014 | Eisert | H01L 33/505 |
| | | | 438/27 |
| 2015/0049510 A1* | 2/2015 | Haiberger | G02B 6/0073 |
| | | | 257/98 |
| 2015/0129914 A1 | 5/2015 | Tien | |
| 2015/0221835 A1 | 8/2015 | Tischler et al. | |
| 2015/0369997 A1 | 12/2015 | Ye et al. | |

FOREIGN PATENT DOCUMENTS

| | | |
|---|---|---|
| DE | 102012102114 A1 | 9/2013 |
| WO | 2013135696 A1 | 9/2013 |

\* cited by examiner

RADIATION-EMITTING COMPONENT AND METHOD FOR PRODUCING A RADIATION-EMITTING COMPONENT

CROSS-REFERENCE TO RELATED APPLICATIONS

This application is a continuation of U.S. patent application Ser. No. 16/969,748, filed Aug. 13, 2020, which is a 35 U.S.C. § 371 National Phase of PCT Application No. PCT/EP2019/052750, filed Feb. 5, 2019, and claims the benefit of German Application No. 10 2018 103 748.1, filed Feb. 20, 2018, the disclosures of which are hereby incorporated by reference herein.

A radiation-emitting component is specified. In addition, a method for producing a radiation-emitting component is specified.

An object to be solved is to specify a radiation-emitting component that is mechanically particularly stable. A further object to be solved is to specify a method for producing such a radiation-emitting component.

A radiation-emitting component is specified. The radiation-emitting component is, for example, a component, which emits electromagnetic radiation, in particular visible light, during operation. For example, the radiation-emitting component is a light-emitting diode.

The radiation-emitting component has a main plane of extension. The lateral directions are aligned parallel to the main plane of extension and the vertical direction is perpendicular to the main plane of extension.

According to at least one embodiment, the radiation-emitting component comprises a carrier, which has a cavity. The cavity penetrates the carrier, for example, partially, in particular not completely. This is to say that the cavity is formed, for example, by at least one side wall and a bottom, which are each part of the carrier. For example, the at least one side wall and the bottom of the carrier are formed in one piece.

A top surface of the bottom of the carrier facing the cavity is formed, for example, flat. The top surface can extend parallel to the main plane of extension of the component. At least one side surface of the side wall of the carrier facing the cavity extends, for example, transverse or perpendicular to the top surface of the bottom of the carrier. The at least one side surface of the carrier facing the cavity can, for example, form an obtuse angle with the top surface of the bottom of the carrier. For example, the obtuse angle between the at least one side surface and the top surface of the bottom can be greater than 90° and less than 180°. Preferably, the angle is less than 135°.

Furthermore, the at least one side surface facing the cavity can comprise at least one step. This is to say that the at least one side surface of the carrier can, for example, extend parallel to the top surface of the bottom of the carrier in regions. As a result of the at least one step, the cavity has, for example, a widening shape in the vertical direction, which faces away from the top surface of the bottom of the carrier. This is to say that a cross-sectional area of the cavity, which extends parallel to the bottom of the carrier, at a position below the at least one step, which is closer to the bottom of the carrier, is smaller than a cross-sectional area above the at least one step, which is further away from the bottom of the carrier. For example, if the at least one side surface has two steps, the cross-sectional area of the cavity at the level of a first step, which is located closer to the bottom of the carrier than a second step, is smaller than the cross-sectional area of the cavity at the level of the second step. For example, each step has a horizontal surface, which extends from the front edge of a step to the front edge of its impact or setting step and which extends parallel, for example, to the main plane of extension of the component.

For example, the carrier contains of a plastic material, such as epoxy or silicone, or a ceramic material or consists of one of these materials. The carrier is, for example, a mechanically stabilizing element of the radiation-emitting component, which mechanically carries and supports further elements of the component.

According to at least one embodiment, the radiation-emitting component comprises a radiation-emitting semiconductor chip which is arranged on the bottom surface delimiting the cavity and which is configured to generate primary electromagnetic radiation. The radiation-emitting semiconductor chip can be a volume emitter, for example.

For example, a volume emitting, radiation-emitting semiconductor chip has a substrate on which, for example, a semiconductor body is epitaxially grown or applied. The substrate can, for example, have one of the following materials or consist of one of the following materials: sapphire, silicon carbide, glass. Volume emitting, radiation-emitting semiconductor chips emit the generated radiation not only through a single light-emitting surface, but also through at least one side surface. For example, in the case of volume emitters, at least 30% of the emitted radiation passes through the at least one side surface. For example, the radiation-emitting semiconductor chip can be a light-emitting diode chip.

For example, the semiconductor body of the radiation-emitting semiconductor chip is configured to generate the primary electromagnetic radiation. For example, the semiconductor body is an epitaxially grown semiconductor body. The semiconductor body can be based on a III-V compound semiconductor material. The semiconductor body comprises an active region, which can include a quantum well structure or a multiple quantum well structure. For example, the active region is configured to generate primary electromagnetic radiation.

For example, the radiation-emitting semiconductor chip comprises a bottom surface, which is located opposite to a top surface of the radiation-emitting semiconductor chip and which are connected by at least one side surface. For example, the bottom surface of the radiation-emitting semiconductor chip is arranged on the top surface of the bottom of the carrier.

According to at least one embodiment, the radiation-emitting component comprises a first reflector layer arranged above a top surface of the semiconductor chip. For example, the first reflector layer completely covers the top surface of the radiation-emitting semiconductor chip. In addition, the first reflector layer can protrude beyond the radiation-emitting semiconductor chip in lateral directions, for example. The first reflector layer comprises, for example, a bottom surface, which is located opposite a top surface and which are connected to one another by at least one side surface.

The at least one side surface of the first reflector layer is, for example, in direct and immediate contact with the at least one side surface of the carrier facing the cavity. In addition, the bottom surface of the first reflector layer facing the top surface of the radiation-emitting semiconductor chip, for example, can also be in direct and immediate contact with the at least one side surface of the carrier facing the cavity in regions. This is possible, for example, because the at least one side surface of the carrier facing the cavity can have at least one step, for example. This is to say that the bottom surface of the first reflector layer can, for example, be arranged on the at least one side surface of the carrier, which extends parallel in regions.

The bottom surface of the first reflector layer can, for example, be in direct and immediate contact with the top surface of the radiation-emitting semiconductor chip. Alternatively, the first reflector layer can be arranged at spaced apart from the radiation-emitting semiconductor chip in vertical direction.

The first reflector layer, for example, is configured to reflect the primary electromagnetic radiation emitted during operation of the radiation-emitting semiconductor chip. The primary radiation, which for example is coupled out through the top surface of the radiation-emitting semiconductor chip during operation, can be reflected, for example, in the direction of the at least one side surface of the carrier or in the direction of the at least one side wall of the carrier.

The first reflector layer can, for example, be formed by a plastic or silicone filled with radiation-scattering and/or radiation-reflecting particles. The particles of the first reflector layer are for example titanium oxide particles.

Alternatively, it is possible that the first reflector layer is only partially reflective and a small proportion of the primary electromagnetic radiation emitted by the semiconductor chip, for example, a maximum of 15%, passes through the first reflector layer.

According to at least one embodiment, the carrier is transparent to the primary electromagnetic radiation in places. For example, the carrier contains a transparent plastic material, such as an epoxy, a silicone, or a transparent ceramic material or consists of one of these materials.

The primary electromagnetic radiation emitted during operation of the radiation-emitting semiconductor chip, which is reflected at the first reflector layer of the at least one side wall of the carrier, can for example exit through the at least one transparent side wall of the carrier.

If the first reflector layer is reflective, for example, the radiation-emitting component represents a side-emitter. However, it is also possible that the first reflector layer is only partially reflective. In this case, the primary electromagnetic radiation emitted in the radiation-emitting semiconductor chip is also coupled out through the top surface of the first reflector layer.

According to at least one embodiment, the semiconductor chip is spaced apart from at least one side surface delimiting the cavity. The side surface delimiting the cavity is, for example, the at least one side surface of the carrier facing the cavity. For example, the semiconductor chip is not in direct contact with the at least one side surface defining the cavity. Between the semiconductor chip and the at least one side surface of the carrier, for example, a further material can be arranged. The further material can be, for example, a solid, a liquid or a gas or a gas mixture, for example air.

In at least one embodiment, the radiation-emitting component comprises a carrier which has a cavity, a radiation-emitting semiconductor chip which is arranged on a bottom surface delimiting the cavity and which is configured to generate primary electromagnetic radiation. In addition, the radiation-emitting component comprises a first reflector layer which is arranged above a top surface of the semiconductor chip. The carrier is transparent in places to electromagnetic radiation and the semiconductor chip is spaced from at least one side surface delimiting the cavity.

A radiation-emitting semiconductor chip arranged on a carrier plate can be covered by different cover bodies. A connecting surface of the different cover bodies extends in lateral directions, for example. This bond can be easily damaged by shear forces acting in the lateral directions. In addition, such a bond can cause dislocations between the cover bodies, for example due to shear forces. A heat accumulation can be induced at such dislocations during operation. In addition to the mechanical stability, this has a negative effect on the thermal stability of the radiation-emitting component.

One idea of the radiation-emitting component described here is, inter alia, to arrange the radiation-emitting semiconductor chip and the cover bodies, comprising reflector and conversion layers, within the cavity of the carrier. Here, the carrier is configured to be transparent. Shear forces occurring in lateral directions therefore do not act directly on the connecting surfaces of the cover bodies in lateral directions. The side walls of the carrier absorb the shear forces and protect the cover bodies from dislocation. In addition, the various cover bodies can be arranged in the cavity of the carrier without the use of complex moulding processes. The advantage of this is that the radiation-emitting components can be produced efficiently.

According to at least one embodiment, the semiconductor chip and the first reflector layer are arranged within the cavity. This is to say that the radiation-emitting semiconductor chip and the first reflector layer do not protrude above the carrier in vertical direction. A top surface delimiting the cavity is, for example, the top surface of the first reflector layer. In addition, the bottom surface delimiting the cavity is partly formed by the bottom surface of the radiation-emitting semiconductor chip. This is to say that the bottom surface delimiting the cavity, the top surface delimiting the cavity and the at least one side surface delimiting the cavity completely enclose the radiation-emitting semiconductor chip and the first reflector layer.

Shear forces acting on the radiation-emitting component from lateral directions therefore do not displace the first reflector layer relative to the radiation-emitting semiconductor chip, since the shear forces are absorbed by the side wall of the carrier.

According to at least one embodiment, a conversion layer is arranged between the semiconductor chip and the first reflector layer and is configured to convert a part of the primary radiation into secondary radiation. The conversion layer has, for example, a top surface located opposite a bottom surface, which is connected via at least one side surface. For example, the top surface of the conversion layer is in direct and immediate contact with the bottom surface of the first reflector layer in regions. The at least one side surface of the conversion layer is, for example, in direct and immediate contact with the at least one side surface of the carrier facing the cavity. In addition, the bottom surface of the conversion layer can, for example, be in direct and immediate contact with the top surface of the radiation-emitting semiconductor chip. The bottom surface of the conversion layer, for example, is formed flat and thus terminates flush with the top surface of the radiation-emitting semiconductor chip. Alternatively, it is possible that at least one side surface of the radiation-emitting semiconductor chip is also covered by the conversion layer.

The bottom surface of the conversion layer can, for example, be in direct and immediate contact with the at least one side surface of the carrier facing the cavity in regions. This is possible because the at least one side surface of the carrier facing the cavity can have at least one step. This is to say that the bottom surface of the conversion layer can, for example, be arranged on the at least one side surface of the carrier which extends parallel in regions.

For example, the conversion layer converts the primary electromagnetic radiation into secondary electromagnetic radiation. The conversion layer comprises, for example, a matrix material into which phosphor particles are incorporated. The matrix material can be a resin, such as an epoxy or silicone or a mixture of these materials, or a ceramic material. The phosphor particles give the conversion layer the wavelength converting properties.

For example, one of the following materials is suitable for the phosphor particles: rare earth doped garnets, rare earth doped alkaline earth sulphides, rare earth doped thiogallates, rare earth doped aluminates, rare earth doped silicates, rare earth doped orthosilicates, Rare earth doped chlorosilicates, rare earth doped alkaline earth silicon nitrides, rare earth doped oxynitrides, rare earth doped aluminium oxynitrides, rare earth doped silicon nitrides, rare earth doped sialons, quantum dots. These materials can also be used without matrix material. The conversion layer can then consist of one of the materials.

According to at least one embodiment, a second reflector layer completely surrounds at least one side surface of the semiconductor chip. The second reflector layer, for example, is in direct and immediate contact with the at least one side surface of the carrier facing the cavity. In addition, a top surface of the second reflector layer, which is located opposite a bottom surface, can be in direct and immediate contact with the bottom surface of the conversion layer. For example, the bottom surface of the second reflector layer can be in direct and immediate contact with the bottom surface of the carrier.

The second reflector layer can, for example, be formed by a plastic or silicone filled with radiation scattering and/or radiation reflecting particles. The particles of the second reflector layer are for example titanium oxide particles.

Alternatively, it is possible that the second reflector layer is only partially reflective and a small proportion, for example, a maximum of 15%, of the primary electromagnetic radiation emitted by the semiconductor chip passes through the second reflector layer.

For example, the first reflector layer and the second reflector layer are configured to reflect a portion of the primary electromagnetic radiation. The first and the second reflector layer thereby have preferably a reflectivity of at least 90% for electromagnetic primary radiation generated in the active region.

According to at least one embodiment, the second reflector layer is in direct contact with the at least one side surface of the semiconductor chip. If, for example, the radiation-emitting semiconductor chip is a volume-emitting semiconductor chip, the primary electromagnetic radiation emitted during operation, which emerges from the at least one side surface of the semiconductor body, is reflected back and can be reflected, for example, in the direction of the conversion layer. This is to say that the primary electromagnetic radiation which is reflected from the at least one side surface of the semiconductor body in the direction of the top surface of the semiconductor body and enters the conversion layer from the top surface of the semiconductor body is partially converted to secondary radiation. By means of the first reflecting layer, the electromagnetic primary and secondary radiation is reflected again, so that the primary radiation enters the conversion layer again and can again be partially converted.

The primary radiation and secondary radiation reflected by the first reflective layer can, for example, be reflected again by the top surface of the second reflective layer. This is to say that the primary radiation and secondary radiation are directed by means of the first and second reflector layer, for example, in the direction of the at least one side surface of the carrier facing the cavity. This advantageously increases the light extraction from the at least one side wall of the carrier.

According to at least one embodiment, the carrier has at least two contact surfaces on a bottom surface and the semiconductor chip is electrically conductively contacted via the at least two contact surfaces. The at least two contact surfaces are, for example, incorporated into the bottom surface of the carrier. The at least two contact surfaces have a top surface which is located opposite a bottom surface and which are connected by at least one side surface. The top surface and the bottom surface of the at least two contact surfaces terminate flush with the top surface and the bottom surface of the bottom of the carrier, for example. For example, the bottom surface of the radiation-emitting semiconductor chip is electrically conductively connected to the top surface of a contact surface. The top surface of the radiation-emitting semiconductor chip is, for example, electrically conductively connected to the top surface of a further contact surface by means of a wire connection. The contact surfaces have a metal or consist thereof, for example. The metal is for example silver or copper.

Alternatively, it is possible that the radiation-emitting semiconductor chip is a flip chip, for example. For example, the semiconductor chip has two chip contact surfaces on the bottom surface of the radiation-emitting semiconductor chip. The two chip contact surfaces are then arranged on the top surface of each contact surface. Each chip contact surface is electrically connected to a contact surface.

According to at least one embodiment, a top surface of the carrier extends obliquely to a bottom surface of the carrier. The top surface of the carrier is, for example, the top surface of the at least one side wall of the carrier. The bottom surface of the carrier is, for example, the bottom surface of the bottom of the carrier. The bottom surface of the carrier is formed substantially parallel to the main plane of extension. For example, the top surface of the carrier extends obliquely to the bottom surface of the carrier. An angle between the top surface of the carrier facing the bottom surface of the carrier and the bottom surface of the carrier facing the top surface of the carrier can be greater than 0° and less than 90°, for example. Preferably the angle is less than 45°.

Regions of the first reflector layer, for example, are arranged on the oblique top surface of the carrier and are in direct and immediate contact with it. The top surface of the first reflector layer, for example, is furthermore formed flat. This is to say that the bottom surface of the first reflector layer has the same slope as the top surface of the carrier. In addition, the top surface of the first reflector layer terminates flush with the top surface of the carrier, for example, where the radiation-emitting component has a greatest vertical extent.

The first reflector layer, for example, completely covers the carrier. This prevents any electromagnetic primary and secondary radiation from exiting through the top surface of the carrier. As a result of the slope, the radiation-emitting component is protected against shear forces acting in lateral directions. For example, if a force acts on the radiation-emitting component in lateral directions, it does not act parallel to a connecting surface of the at least one side wall of the carrier and the first reflector layer. Advantageously, the radiation-emitting component is thus protected against damage caused by shear forces.

According to at least one embodiment, the carrier has a reflective part and a transparent part. For example, the bottom of the carrier is formed reflective for the primary radiation emitted by the semiconductor chip. The at least one side wall of the carrier is, for example, formed transparent for the primary radiation and the secondary radiation. The parts can, for example, be formed in one piece.

According to at least one embodiment, the reflective part of the carrier comprises a side wall and a bottom and a top surface of the side wall of the reflective part of the carrier extends obliquely to a bottom surface of the bottom of the reflective part of the carrier, wherein the parts are formed in one piece. That is to say that the bottom of the carrier and a part of the at least one side wall of the carrier are formed reflective to primary radiation emitted from the radiation-emitting semiconductor chip. The reflective bottom of the carrier and the at least one reflective side wall of the carrier are thereby formed in one piece.

The top surface of the at least one reflective side wall is, for example, obliquely to the bottom surface of the carrier. An angle between the top surface of the reflective part of the carrier and the bottom surface of the carrier can, for example, be greater than 0° and less than 90°. Preferably, the angle is less than 45°.

According to at least one embodiment, a top surface of the transparent part of the carrier extends obliquely to the bottom surface of the bottom of the reflecting carrier. A further part of the at least one side wall of the carrier is, for example, formed transparent for the primary radiation and the secondary radiation and is arranged on the part of the side wall of the carrier which is formed reflective.

The top surface of the transparent part of the carrier is, for example, the top surface of the transparent part of the at least one side wall of the carrier. For example, this top surface extends obliquely to the bottom surface of the carrier. An angle between the top surface of the transparent part of the carrier facing the bottom surface of the carrier and the bottom surface of the carrier facing the top surface of the transparent part of the carrier can be, for example, greater than 0° and less than 90°. Preferably, the angle is less than 45°.

A bottom surface located opposite the top surface of the at least one side wall of the transparent part preferably has the same slope and is in direct and immediate contact with the oblique top surface of the at least one reflecting side wall of the carrier. The two slopes are, for example, of the same size.

The carrier here, for example, is not formed in one piece. As a result of the oblique connection of the at least one reflective and transparent side wall of the carrier, the radiation-emitting component is protected against shear forces acting in the lateral directions. If, for example, a force acts on the radiation-emitting component in lateral directions, it does not act parallel to a connecting surface of the at least one reflective and transparent side wall of the carrier. Advantageously, the radiation-emitting component is thus protected against damage caused by shear forces.

Moreover, a method for producing a radiation-emitting component is specified. Preferably, the method is suitable for producing a radiation-emitting component described here. This is to say that a radiation-emitting component described here can be produced using the method described or is produced using the method described. All features disclosed in connection with the radiation-emitting component are therefore also disclosed in connection with the method and vice versa.

According to at least one embodiment, the method comprises the step of providing a carrier which has a cavity. The cavity can be generated, for example, by material removal of the carrier material. Alternatively, the cavity can be generated as a recess, for example, by using a suitable casting process.

In a first step, it is possible to provide a bottom of the carrier, which is formed reflective, for example. At least one side wall of the carrier, which is formed transparent, for example, is applied to a top surface of the reflective bottom of the carrier in a next step.

Alternatively, it is possible that in a first method step a reflective bottom of the carrier and a reflective part of the at least one side wall of the carrier is provided. In a next step, for example, the further reflective part of the at least one side wall of the carrier is then applied to a top surface of the reflective at least one side wall of the carrier.

The at least one transparent side wall is applied, for example by means of an injection moulding or casting process, to the reflective bottom or to the at least one reflective side wall.

According to at least one embodiment, the method comprises the step of applying a radiation-emitting semiconductor chip to the carrier, at a bottom surface defining the cavity, wherein the semiconductor chip being spaced apart from a side surface defining the cavity. The carrier comprises, for example, at least two contact surfaces which, for example, contain of a metal or consist thereof. In addition, the semiconductor chip comprises at least two chip contact surfaces, which for example contain of a metal or consist thereof. The chip contact surfaces can be applied to a respective contact surface, for example, by gluing, bonding or soldering. This connection attaches the semiconductor chip to the carrier.

According to at least one embodiment, the method comprises the step of applying a first reflector layer above the semiconductor chip.

For example, a material of the first reflector layer is introduced into the cavity. Here, the material of the first reflector layer is present in a flowable form, for example. In this case, the material of the first reflector layer is cured after the application to form the first reflector layer. Furthermore, the material of the first reflector layer can be applied by spraying, screen printing or doctor blading.

According to at least one embodiment, the method comprises the step of applying a second reflector layer after the semiconductor chip is applied, wherein the second reflector layer covers a side surface of the semiconductor chip.

For example, a material of the second reflector layer is introduced into the cavity. Here, the material of the second reflector layer is present in a flowable form, for example. In this case, the material of the second reflector layer is cured after being applied to the second reflector layer. Furthermore, the material of the second reflector layer can be applied by spraying, screen printing or doctor blading, for example.

The second reflector layer does not cover the top surface of the radiation-emitting semiconductor chip, for example. This is to say that the top surface of the radiation-emitting semiconductor chip is substantially free of the second reflector layer. Substantially free means that small quantities of the second reflector layer are on the top surface of the radiation-emitting semiconductor chip due to the production method.

According to at least one embodiment, the method comprises the step, after applying the second reflector layer, a conversion layer is applied to the semiconductor chip and to the second reflector layer.

For example, a conversion material of the conversion layer is introduced into the cavity. Here, the conversion material is present in a flowable form, for example. In this case, the conversion material is cured after application to form the conversion layer. The conversion material can also be applied by spraying, screen printing or doctor blading.

In the following, the radiation-emitting component described here and the method described here are explained in more detail using exemplary embodiments and the associated figures.

Figure 2A:
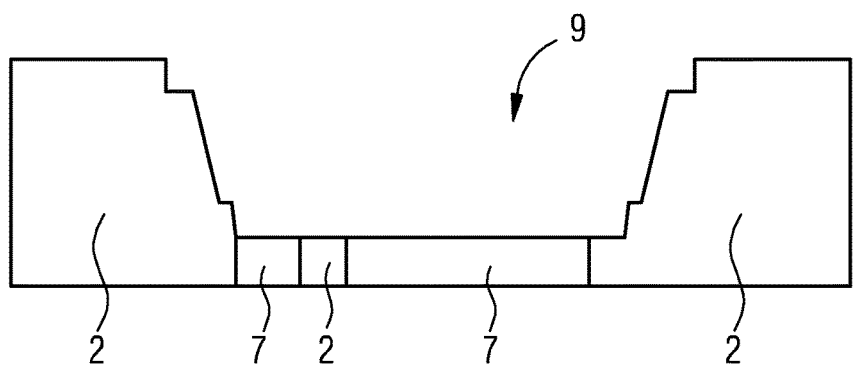
Figure 2B:
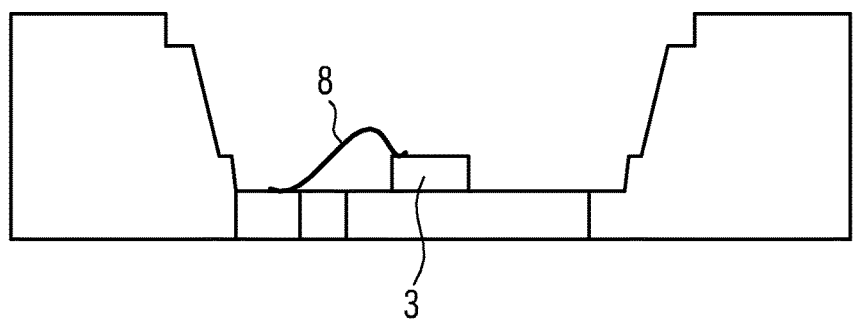
Figure 2C:
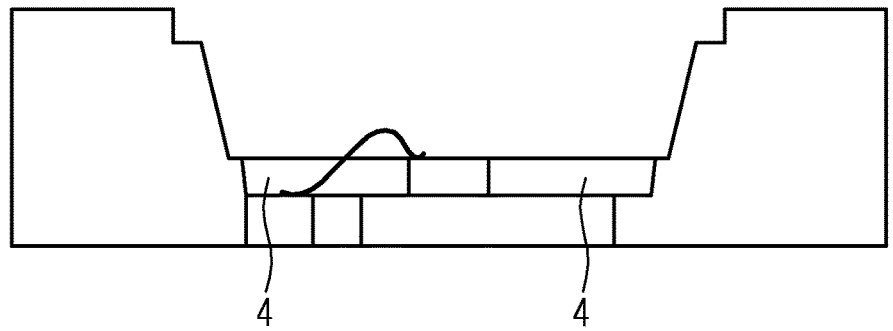
Figure 2D:
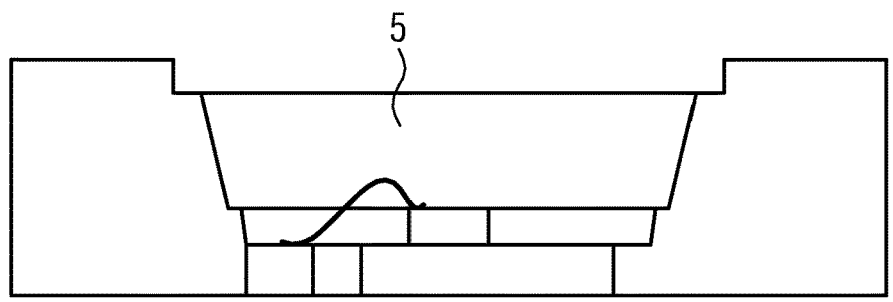
Figure 2E:
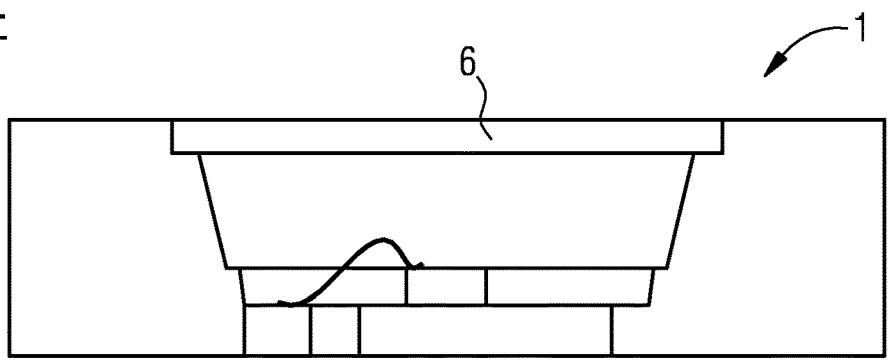
Figure 3:
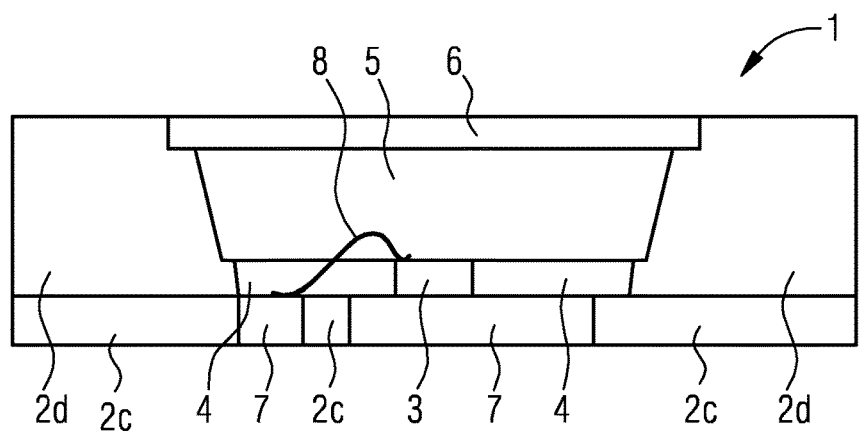
Figure 4A:
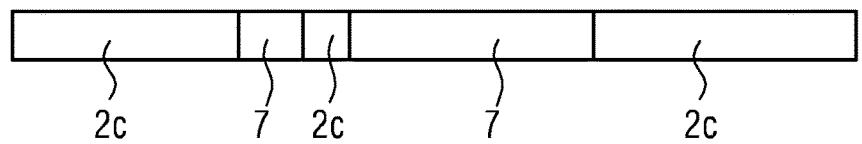
Figure 4B:
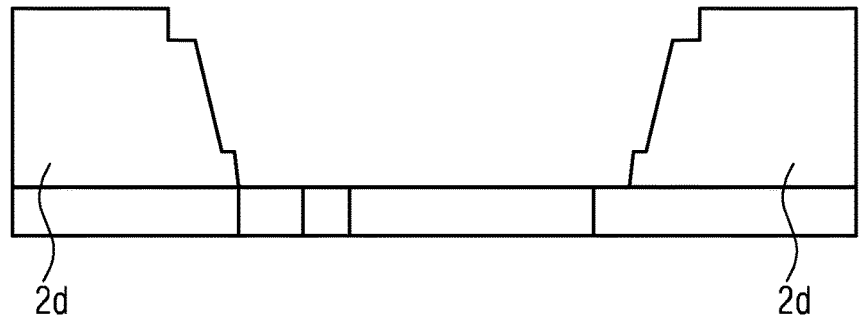
Figure 4C:
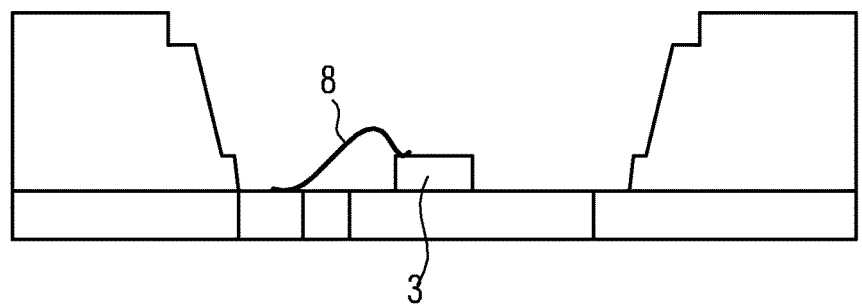
Figure 4D:
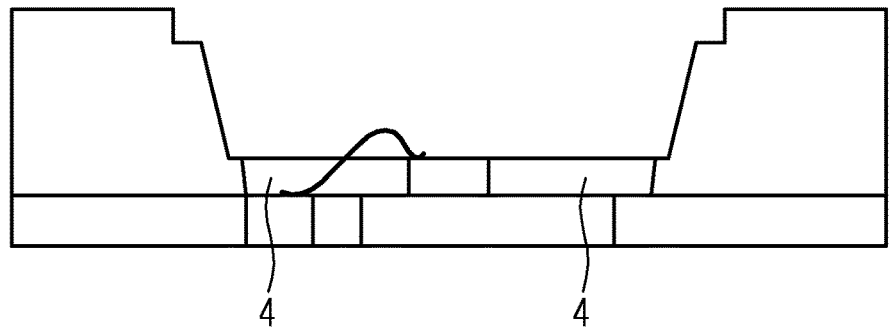
Figure 4E:
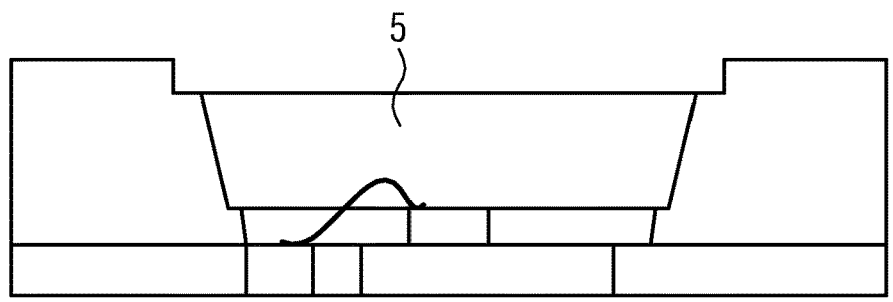
Figure 4F:
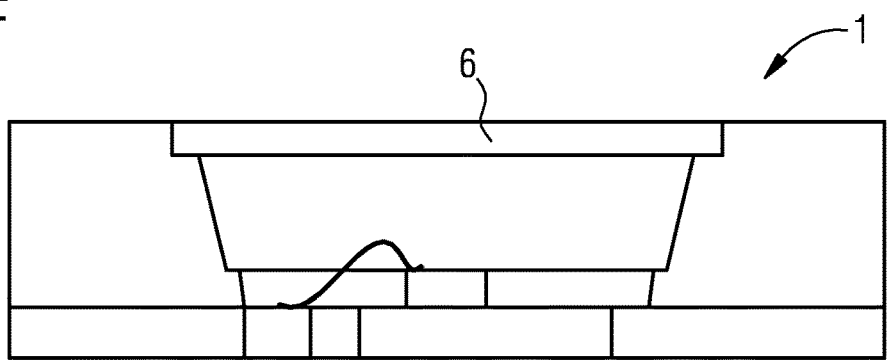
Figure 5:
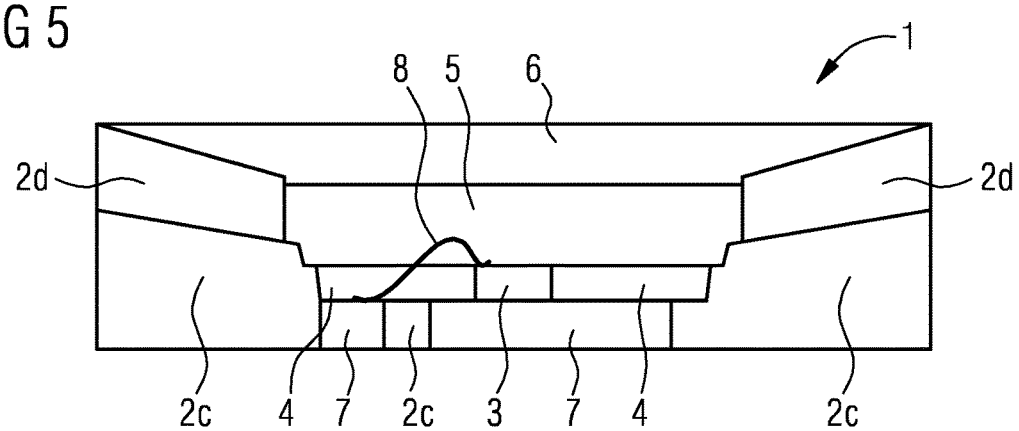
Figure 6A:
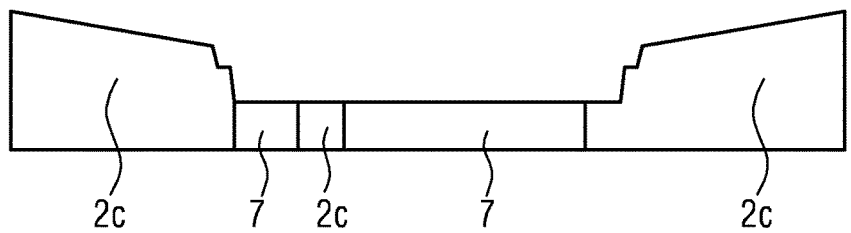
Figure 6B:
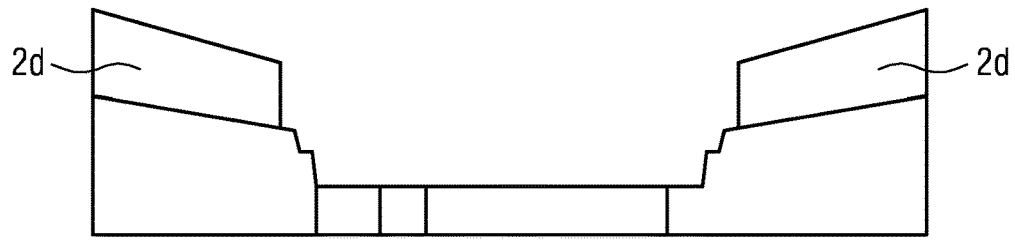
Figure 6C:
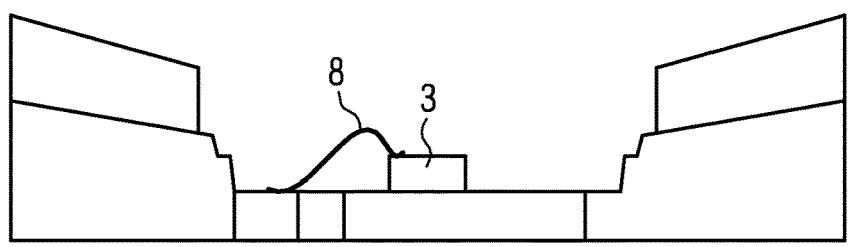
Figure 6D:
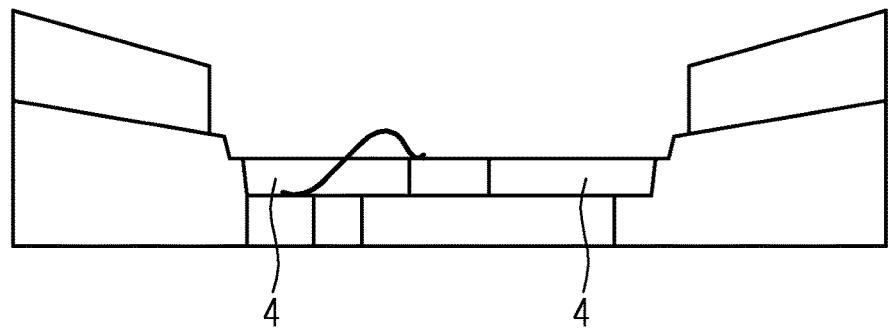
Figure 6E:
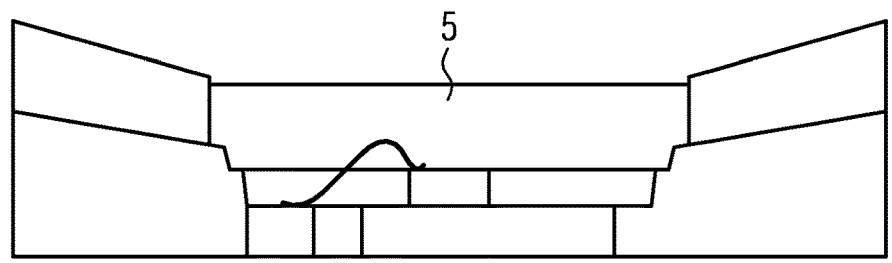
Figure 6F:
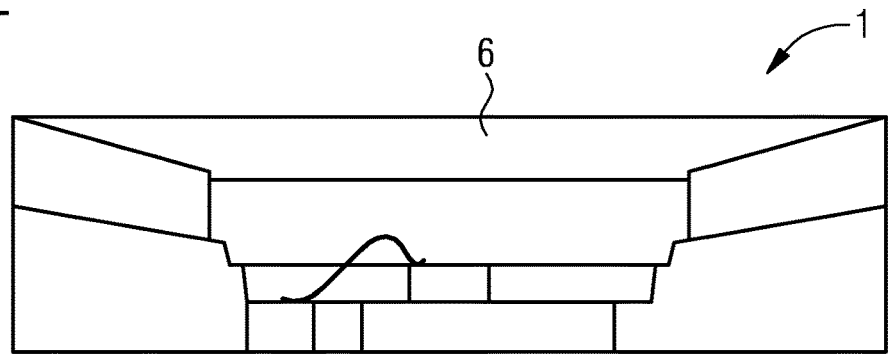

They Show:

FIG. 1 schematic sectional views of an exemplary embodiment of a radiation-emitting component described here, FIGS. 2A, 2B, 2C, 2D and 2E schematic sectional views of method steps of an exemplary embodiment of a method described here for producing a radiation-emitting component, FIG. 3 schematic sectional view of an exemplary embodiment of a radiation-emitting component described here, FIGS. 4A, 4B, 4C, 4D, 4E and 4F schematic sectional views of method steps of an exemplary embodiment of a method described here for producing a radiation-emitting component, FIG. 5 schematic sectional view of an exemplary embodiment of a radiation-emitting component described here, FIGS. 6A, 6B, 6C, 6D, 6E and 6F schematic sectional views of method steps of an exemplary embodiment of a method described here for producing a radiation-emitting component.

Identical, similar or similarly acting elements are provided with the same reference signs in the Figures. The Figures and the proportions of the elements displayed in the Figures to one another are not to be regarded as true to scale. Rather, individual elements can be shown in exaggerated size for better representability and/or comprehensibility.

The schematic sectional view of FIG. 1 shows an exemplary embodiment of a radiation-emitting component described here.

The radiation-emitting component 1 comprises a carrier 2, which has a cavity 9. The carrier 2, for example, has a bottom and a side wall. The bottom 2a and the side wall 2b of carrier 2 are formed in one piece. A side surface of the side wall 2b of carrier 2 facing the cavity 9 has two steps 22. The bottom 2a of carrier 2 comprises a top surface and an opposite bottom surface. Two contact surfaces 7 are incorporated in the bottom 2a of the carrier 2. The contact surfaces 7 also have a top surface located opposite a bottom surface, which are connected to one another via a side surface. The top surfaces of the contact surfaces 7 terminate flush with the top surface of the bottom 2a of the carrier 2.

The bottom surfaces of the contact surfaces 7 terminate also flush with the bottom surface of the bottom 2a of the carrier 2.

In addition, the radiation-emitting component 1 comprises a radiation-emitting semiconductor chip 3. The semiconductor chip 3 comprises a top surface located opposite a bottom surface, which are connected to one another via a side surface. The bottom surface of the semiconductor chip 3 is arranged on the top surface at one of the contact surfaces 7 and is electrically conductively connected. Via these contact surfaces, the radiation-emitting semiconductor chip 3 can be energized from the bottom surface of the radiation-emitting semiconductor chip 3. Furthermore, the top surface of the radiation-emitting semiconductor chip is electrically conductively connected to the top surface of the further contact surface 7 by means of a bonding wire 8.

A second reflector layer 4 completely surrounds the at least one side surface of the radiation-emitting semiconductor chip 3. The at least one side surface of the radiation-emitting semiconductor chip 3 is thereby in direct and immediate contact with the second reflector layer 4. In addition, the second reflector layer 4 is in direct and immediate contact with the top surface of the bottom 2a of the carrier 2 and the top surfaces of the contact surfaces 7. Furthermore, the at least one side surface of the side wall 2b of the carrier 2, which faces the cavity 9, is in direct and immediate contact with the second reflector layer 4 in regions. A top surface of the second reflector layer 4 terminate flush with a first step.

A conversion layer 5 is arranged above the top surface of the second reflector layer 4 and the top surface of the radiation-emitting semiconductor chip 3. The conversion layer is in direct and immediate contact with the top surface of the second reflector layer 4 and the top surface of the radiation-emitting semiconductor chip 3. In addition, the conversion layer 5 is in direct and immediate contact with the side surface of the side wall 2b of the carrier 2 in regions, which faces the cavity 9. A top surface of the conversion layer 5 terminates flush with a second step.

A first reflector layer 6 is arranged above the conversion layer 5. The first reflector layer 6 is in direct and immediate contact with the top surface of the conversion layer 5. In addition, the first reflector layer 6 is in direct and immediate contact with the side surface of the side wall 2b of the carrier 2, which faces the cavity 9. A top surface of the first reflector layer 6 terminates flush with a top surface of the side wall 2b of the carrier 2. The first reflector layer 6, the conversion layer 5, the radiation-emitting semiconductor chip 3 and the second reflector layer 4 are arranged within cavity 9.

In connection with FIGS. 2A to 2E, an exemplary embodiment of a production method for a radiation-emitting component described here is shown according to the previous exemplary embodiment.

According to FIG. 2A, the first method step is to provide the transparent carrier 2, which has the cavity 9. The bottom 2a of the carrier comprises two contact surfaces 7. The side wall 2b and the bottom 2a of the carrier 2 are formed in one piece.

According to FIG. 2B, in a next method step the radiation-emitting semiconductor chip 3 is arranged on a bottom surface delimiting the cavity 9. Here, the semiconductor chip 3 is arranged with its bottom surface on the top surface of a contact surface 7 and is electrically conductively connected. The top surface of the semiconductor chip 3 is electrically conductively connected to the top surface of a further contact surface 7 by means of a wire connection 8.

According to FIG. 2C, in a next method step a second reflection layer 4 is arranged laterally of the radiation-emitting semiconductor chip 3 and on a bottom surface delimiting the cavity 9. The top surface of the second reflection layer 4 terminates flush with the top surface of the radiation-emitting semiconductor chip 3.

According to FIG. 2D, a conversion layer 5 is arranged above the second reflection layer 4 and the radiation-emitting semiconductor chip 3 in a next method step.

According to FIG. 2E, a next method step is to apply a first reflector layer 6 above the conversion layer 5.

The schematic sectional view of FIG. 3 shows an exemplary embodiment of a radiation-emitting component described here. In contrast to the exemplary embodiment shown in FIG. 1, the carrier 2 has a reflective bottom 2c and a transparent side wall 2d.

In connection with FIGS. 4A to 4F, an exemplary embodiment of a production method for a radiation-emitting component described here is shown in accordance with the previous exemplary embodiment.

According to FIG. 4A, the first method step is to provide the reflective bottom 2c of the carrier 2. This comprises two contact surfaces 7.

According to FIG. 4B, in a next method step, a transparent side wall 2d is applied to the reflective bottom 2c of the carrier 2. The transparent side wall 2d can be applied by means of a potting process.

According to FIGS. 4C to 4F, further method steps are shown analogous to those in FIGS. 2B to 2E.

The schematic sectional view of FIG. 5 shows an exemplary embodiment of a radiation-emitting component described here. In contrast to the exemplary embodiment shown in FIG. 3, the carrier 2 has a reflective bottom 2c and a side wall that is partially reflective. The reflective bottom 2c and the reflective part of the side wall are formed in one piece. In addition, the top surface of the reflective part of the side wall has a slope with respect to the top surface of the bottom of the carrier 2. A transparent side wall 2d is arranged above the reflective part of the side wall. This also has a top surface, which extends obliquely to the top surface of the bottom of carrier 2.

In connection with FIGS. 6A to 6F, an exemplary embodiment of a production method for a radiation-emitting component described here is shown in accordance with the previous exemplary embodiment. FIGS. 6A to 6F show further method steps similar to those in FIGS. 4A to 4F.

The priority of the German patent application 102018103748.1 is claimed, whose disclosure is hereby expressly incorporated by reference.

The invention is not restricted to the exemplary embodiments by the description on the basis of the exemplary embodiments. Rather, the invention includes each new feature and each combination of features, which includes in particular each combination of features in the patent claims, even if this feature or this combination itself is not explicitly indicated in the patent claims or exemplary embodiments.

LIST OF REFERENCE SIGNS 1 radiation-emitting component
2 carrier
2a bottom of the carrier
2b side wall of the carrier
22 step
2c reflective bottom of the carrier
2d transparent side wall of the carrier
3 radiation-emitting semiconductor chip
4 second reflector layer
5 conversion layer
6 first reflector layer
7 contact surface
8 wire connection
9 cavity

The invention claimed is:
1. Radiation-emitting component with
a carrier having a cavity,
a radiation-emitting semiconductor chip which is arranged on a bottom surface delimiting the cavity and which is configured to generate primary electromagnetic radiation, and
a first reflector layer arranged above a top surface of the semiconductor chip,
wherein
the carrier has at least one side wall and a bottom,
the carrier is transparent in places to the primary electromagnetic radiation,
the semiconductor chip is spaced apart from at least one side surface delimiting the cavity,
the side wall has a transparent part and a reflective part,
a top surface of the reflective part extends obliquely to the bottom surface, and
the transparent part is arranged on the top surface of the reflective part.

2. Radiation-emitting component according to claim 1, in which the reflective part of the side wall is formed in one piece with the bottom.

3. Radiation-emitting component according to claim 1, in which the at least one side surface is formed of the transparent part and the reflective part.

4. Radiation-emitting component according to claim 1, in which the semiconductor chip and the first reflector layer are arranged inside the cavity.

5. Radiation-emitting component according to claim 1,
in which a conversion layer is arranged between the semiconductor chip and the first reflector layer and is configured to convert a part of the primary radiation into secondary radiation.

6. Radiation-emitting component according to claim 1,
in which a second reflector layer completely surrounds at least one side surface of the semiconductor chip in lateral directions.

7. Radiation-emitting component according to claim 6,
in which the second reflector layer is in direct contact with the at least one side surface of the semiconductor chip.

8. Radiation-emitting component according to claim 1,
in which the carrier has at least two contact surfaces on the bottom surface and the semiconductor chip is electrically conductively contacted via the at least two contact surfaces.

9. Radiation-emitting component according to claim 1, in which the cavity is delimited by the at least one side wall and the bottom, which are each part of the carrier of the radiation-emitting component.

10. Radiation-emitting component according to claim 1, in which
a top surface of the transparent part extends obliquely to the bottom surface.

11. Radiation-emitting component with
a carrier having a cavity,
a radiation-emitting semiconductor chip which is arranged on a bottom surface delimiting the cavity and which is configured to generate primary electromagnetic radiation, and
a first reflector layer arranged above a top surface of the semiconductor chip,
wherein
the carrier is transparent in places to the primary electromagnetic radiation,
the semiconductor chip is spaced apart from at least one side surface delimiting the cavity, and
the at least one side surface facing the cavity comprises at least one step,
the first reflector layer is arranged on the at least one step,
the first reflector layer extends parallel to the bottom surface, and
a bottom surface of the first reflector layer facing the radiation-emitting semiconductor chip and a top surface of the first reflector layer facing away from the radiation-emitting semiconductor chip each extends parallel to the bottom surface on which the radiation-emitting semiconductor chip is arranged.

12. Radiation-emitting component according to claim 11, in which
the at least one step has a horizontal surface, which extends parallel to the bottom surface.

13. Radiation-emitting component according to claim 12, in which
the first reflector layer is in direct contact to the horizontal surface.

\* \* \* \* \*